(12) United States Patent
Aspandiar et al.

(10) Patent No.: US 6,651,869 B2
(45) Date of Patent: Nov. 25, 2003

(54) METHODS AND ELECTRONIC BOARD PRODUCTS UTILIZING ENDOTHERMIC MATERIAL FOR FILLING VIAS TO ABSORB HEAT DURING WAVE SOLDERING

(75) Inventors: Raiyomand F. Aspandiar, Portland, OR (US); Tom E. Pearson, Beaverton, OR (US); Christopher Combs, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/957,532

(22) Filed: Sep. 21, 2001

(65) Prior Publication Data

US 2003/0057265 A1 Mar. 27, 2003

(51) Int. Cl.[7] .................... B23K 31/00; B23K 31/02; B23K 5/22; H05K 1/11
(52) U.S. Cl. .................... 228/180.21; 228/180.22; 228/216; 174/263; 174/264
(58) Field of Search .................. 228/260, 37, 36, 228/216, 259, 180.1, 175, 180.22, 215; 174/263–265

(56) References Cited

U.S. PATENT DOCUMENTS

| 3,966,110 | A | * | 6/1976 | Boynton | 228/175 |
|---|---|---|---|---|---|
| 3,973,322 | A | | 8/1976 | Boynton | |
| 4,127,692 | A | | 11/1978 | Boynton | |
| 4,180,199 | A | | 12/1979 | O'Rourke et al. | |
| 4,373,655 | A | | 2/1983 | McKenzie, Jr. | |
| 4,661,654 | A | * | 4/1987 | Strobel | 174/263 |
| 4,767,298 | A | * | 8/1988 | Bocchicchio et al. | 425/112 |
| 5,152,702 | A | * | 10/1992 | Pilny | 228/216 |
| 5,488,539 | A | * | 1/1996 | Testa et al. | 228/215 |
| 5,511,306 | A | * | 4/1996 | Denton et al. | 228/180.1 |
| 5,704,535 | A | | 1/1998 | Thompson, Sr. | |
| 5,716,663 | A | * | 2/1998 | Capote et al. | 156/277 |
| 5,739,586 | A | | 4/1998 | Cannizzaro et al. | |
| 5,883,335 | A | * | 3/1999 | Mizumoto et al. | 174/266 |
| 5,888,627 | A | * | 3/1999 | Nakatani | 174/264 |
| 5,930,601 | A | | 7/1999 | Cannizzaro et al. | |
| 6,010,920 | A | | 1/2000 | Hellgren et al. | |
| 6,060,778 | A | * | 5/2000 | Jeong et al. | 257/697 |
| 6,076,726 | A | * | 6/2000 | Hoffmeyer et al. | 228/180.22 |
| 6,114,098 | A | * | 9/2000 | Appelt et al. | 427/96 |
| 6,202,739 | B1 | | 3/2001 | Pal et al. | |
| 6,248,961 | B1 | * | 6/2001 | Enroth et al. | 174/263 |
| 6,284,353 | B1 | * | 9/2001 | Takada et al. | 174/255 |
| 2002/0187260 | A1 | * | 12/2002 | Sheppard et al. | 427/248.1 |

* cited by examiner

Primary Examiner—Tom Dunn
Assistant Examiner—L. Edmondson
(74) Attorney, Agent, or Firm—Schwegman, Lundberg, Woessner & Kluth, P.A.

(57) ABSTRACT

A method of wave soldering a circuit board while avoiding reflow of a solder joint on the topside of the board from heat conducted from the solder wave through at least one via in the board in heat conducting relation with the topside solder joint, comprises subjecting the circuit board to a solder wave and absorbing heat being conducted from the solder wave through the at least one via with an endothermic material in the via hole which undergoes a heat absorbing reaction. The heat absorbing reaction of the endothermic material is preferably a phase change, such as melting. The melted endothermic material is retained in the via hole during wave soldering by capillary forces and a cap on the lower end of the via hole. A disclosed method of making the circuit board includes locating the endothermic material in the via hole by inserting a preform of the endothermic material into the via hole or hot dispensing the endothermic material into the via hole. An electronic board product for practicing the method/made by the method is also disclosed.

32 Claims, 2 Drawing Sheets

METHODS AND ELECTRONIC BOARD PRODUCTS UTILIZING ENDOTHERMIC MATERIAL FOR FILLING VIAS TO ABSORB HEAT DURING WAVE SOLDERING

TECHNICAL FIELD

The present invention relates to a wave soldering method and to an electronic board product that has at least one component on the topside of the board soldered with solder joints which are prone to topside reflow during wave soldering of the board. The invention is particularly useful for boards which have dense via structures such as via-in-pad and via-between-pad design structures.

BACKGROUND

The secondary reflow of solder joints of topside, surface mounted components on mother boards and server boards during the wave soldering process of the boards is a known problem. Three causes of this topside reflow of surface mounted components are shown in FIG. 1. The primary cause is the conduction of heat, represented by arrows A in FIG. 1, from the solder wave 13 against the lower side of the board 14 through vias 15 in the board, by way of the via hole plating 16 forming the through vias, to the surface mount land 17 and solder joint(s) thereon on the topside of the circuit board. A secondary reason is the radiation of heat, see arrows B in FIG. 1, from heaters 18 above the board, which are primarily there to apply pre-heat. A third reason is the transfer of heat, depicted by arrows C in FIG. 1, by conduction through the laminate material of the board 14. Recent development of via-in-pad design structures increases the likelihood of topside reflow of ball grid array (BGA) component, 19 in FIG. 1, solder joints whose land patterns have these via-in-pad structures designed in.

Several known techniques for alleviating the problem of topside component reflow are shown in FIG. 2. A non-metallic solder wave shield 20 is placed under the bottom of the board, to prevent the solder from touching the vias. This wave shield is typically attached to the wave solder pallet. A heat shield 21 can also be placed above the board on the topside, covering all components prone to topside reflow. The holes 22 of the vias 15 can also be capped as shown at 23 with solder mask material to prevent the solder wave from getting into the via holes. An example of a shield and method for selective wave soldering are disclosed in U.S. Pat. No. 5,704,535. See also U.S. Pat. No. 5,739,586 which discloses the use of tape over the lower end of via holes to hold solder in the holes. U.S. Pat. No. 5,888,627 discloses filling through holes for vias with an electroconductive resin paste. Typically, materials used to fill via holes in printed circuit boards are epoxy based thermoset materials which do not undergo a phase change during the wave soldering process.

Vias are to be distinguished from through holes for component leads in electronic boards. Vias are smaller in diameter than component lead through holes, 10 to 13 mils diameter holes are used for vias, for example, as compared with 22 to 36 mils diameter holes for component lead through holes. Also, the primary function of a component lead through hole is to form a solder fillet with a component lead protruded into the through hole, whereas the primary function for a via is electrically connecting traces on different layers of the board. There is no component lead in a via but both via holes and component lead through holes have copper barrel plating therein. Vias are designed as small as possible to take up minimal space on the board. Solder will always fill a component lead through hole during wave soldering, but not necessarily so for a via.

Temporarily plugging through holes for component leads during wave soldering for preserving the holes in an unobstructed manner is taught by U.S. Pat. No. 4,373,655. A pin of a plastic material, e.g., glass filled nylon, that is stable in the presence of the high temperatures commonly encountered in mass soldering processes is placed in the through hole during soldering and removed after the soldering operation. The patent also refers to the use of latex tape placed over the ends of the holes to be spared on the underneath side of the printed circuit board, to mask such holes from solder. The use of wooden toothpicks and uniformly tapered, thermally conductive metal pins are also disclosed for this purpose.

The use of wax as a cement or jig to hold a component lead in position in a through hole in a circuit board during wave soldering to through hole mount a component on the board is known, see U.S. Pat. Nos. 4,180,199, 4,127,629, 3,973,322, and 3,966,110, for example. In these processes, the wax melts upon exposure to the molten solder during wave soldering and is removed from the board and component leads.

U.S. Pat. No. 6,202,739B1 is cited of interest for its disclosure of an apparatus, particularly a hand-held electronic device such as a cellular telephone or two-way radio, including a heat dissipating apparatus for effectively removing heat from a heat-generating electronic component of the apparatus, and a method of forming the same. An endothermic, phase change material is enclosed within a sealed cavity in the apparatus where it is thermally coupled to the heat-generating component therein to dissipate heat therefrom during operation of the electronic device.

BRIEF DESCRIPTION OF THE DRAWINGS

The following represents brief descriptions of the drawings, wherein.

DETAILED DESCRIPTION

The present invention is directed to an improved method of wave soldering and a method of making a circuit board which can be wave soldered without reflowing a solder joint or joints on the topside of the board from heat conducted from the solder wave through a via or vias in the board in heat conducting relation with the topside solder joint(s). The invention also includes an electronic board product for practicing the method/made by the method of making. According to the method of wave soldering a circuit board according to the invention, the circuit board is subjected to a solder wave, and heat conducted from the solder wave through the at least one via is absorbed with an endothermic material in the via hole which undergoes a heat absorbing reaction. This reaction is a phase change, such as melting, in the example embodiment. The absorption of heat by the endothermic material in the via hole prevents the reflow of the topside solder joint for components, such as ball grid arrays, that are prone to this defect.

Figure 3:
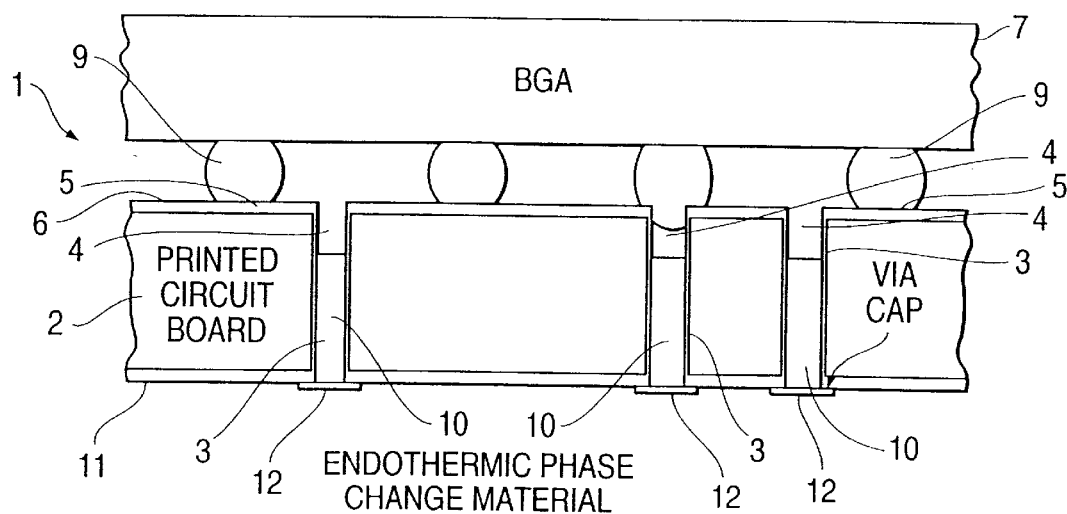
FIG. 3 is a schematic drawing of a printed circuit board according to an example embodiment of the invention having an endothermic material in the via holes for heat absorption during wave soldering according to the method of the invention.

A portion of an electronic board product 1 made according to the present invention is shown in FIG. 3. The product comprises a printed circuit board 2 having a plurality of through vias 3 with via holes 4 extending through the thickness of the circuit board. The vias 3 are formed by conductive metal, e.g., copper, plated on the inner surfaces of through holes formed in the circuit board. The vias 3 are arranged in heat conducting relation with pads 5 on the topside 6 of the circuit board. In the example embodiment the board 2 has a dense via structure with both via-in-pad and via-between pad design structures. A ball grid array component 7 is mounted on the topside of the circuit board by a plurality of balls of solder 9 soldered to respective ones of the pads 5.

Figure 1:
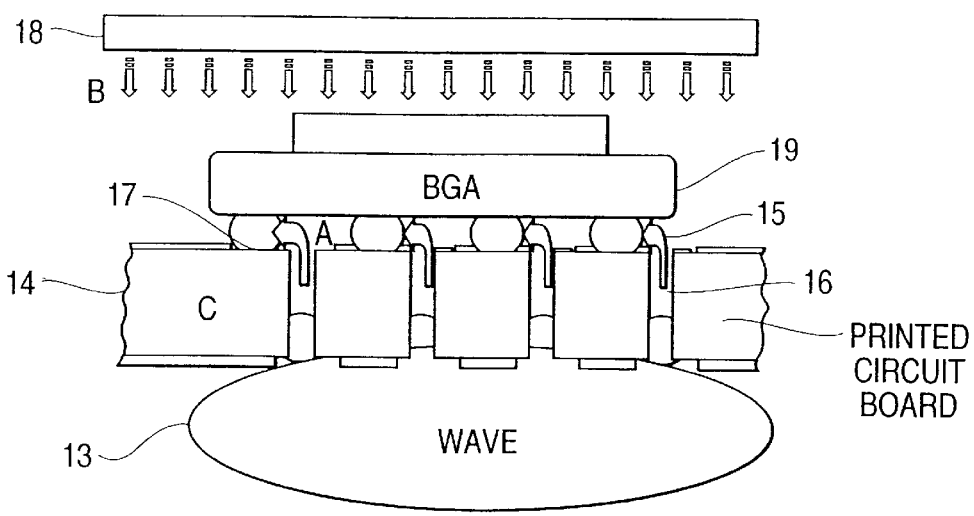
FIG. 1 is a schematic illustration of a conventional printed circuit board with a topside, surface mounted component thereon showing the board during wave soldering according to a known wave soldering process and depicting the heat pathways, by arrows A, B and C, associated therewith.
Figure 2:
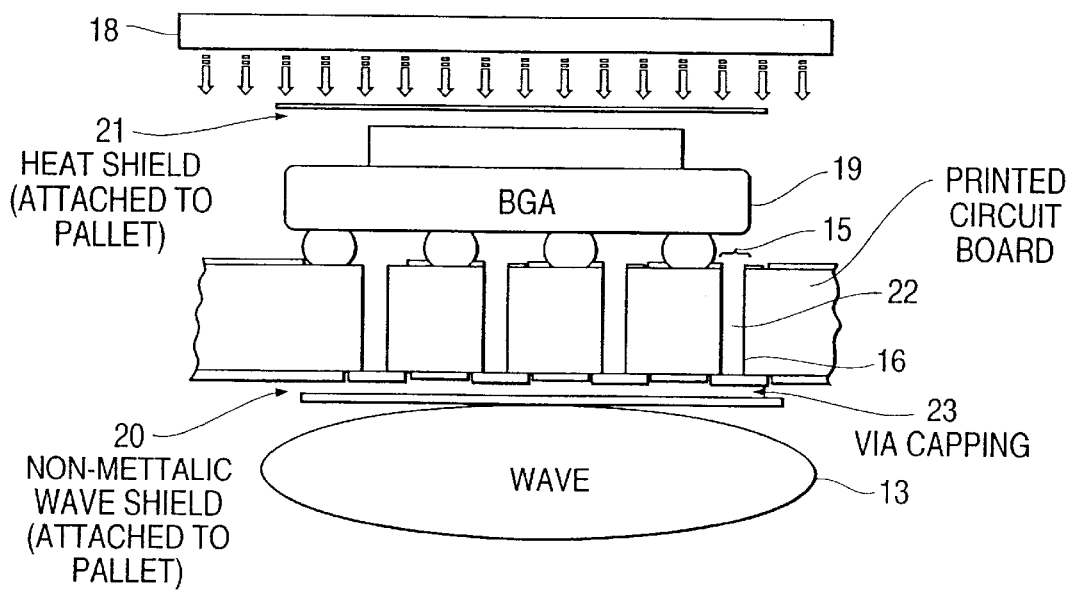
FIG. 2 is a schematic illustration similar to FIG. 1 showing the prior art methods and apparatus for avoiding topside ball grid array (BGA) component solder joint reflow during wave soldering of the circuit board, particularly by means of a heat shield, a non-metallic solder wave shield and via capping.

An endothermic material 10 is located in the via holes 4. The endothermic material undergoes a heat absorbing reaction to heat being conducted from a solder wave through the vias during wave soldering of the circuit board. As depicted in FIG. 1, during wave soldering the bottom side 11 of the circuit board 2 is passed against a solder wave for forming other solder joints, not shown, on the circuit board.

The endothermic material 10 in the example embodiment is a material having an endothermic phase change reaction, preferably melting in the temperature range 50° C. to 200° C. Besides the melting point, the latent heat of fusion is also an important property of the material. The larger the latent heat of fusion, the larger the heat absorbed by the material when it melts. The latent heat of fusion of a solid is the amount of energy that must be transferred to one gram of the solid, at its melting point, in order to melt it. It is called latent heat because there is no temperature change associated with this energy transfer, there is only a change in phase.

Alkali chlorides, iodides and waxes are endothermic materials which fall in the aforementioned melting point range. However, alkali chlorides are to be avoided as they will cause insulation resistance problems in printed circuit boards. Waxes are preferred endothermic materials, including bees wax, carnauba wax and paraffin wax, which have melting points in the 50° to 80° C. range and latent heats of fusion in the 42 to 45 cals/gram range. Gutta-percha has similar properties and can also be used as the endothermic material according to the present invention.

The endothermic material in the example embodiment is formed into a cylindrical preform so that it can be inserted into a via hole. The waxes mentioned above are soft and can be made into cylindrical preforms very easily. For convenience during insertion, the preforms preferably have a diameter less than that of the via holes. While insertion of the preforms could be done manually, it is preferred to package the preforms into standard tape and reel format and to insert the preforms into the via holes by the pick and place machine used for surface mounted component placement. Alternatively, the endothermic material can be hot dispensed into the via holes with a wax dispensing machine before components are placed on the board.

Figure 4A:
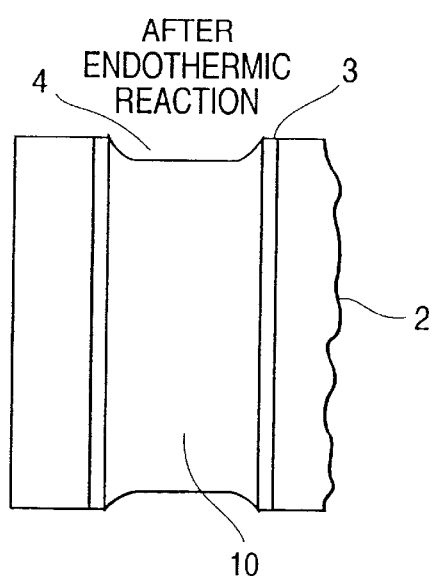
FIG. 4A is an enlarged view of a via hole of the circuit board of FIG. 3 showing the endothermic material in the via hole after endothermic reaction.
Figure 4B:
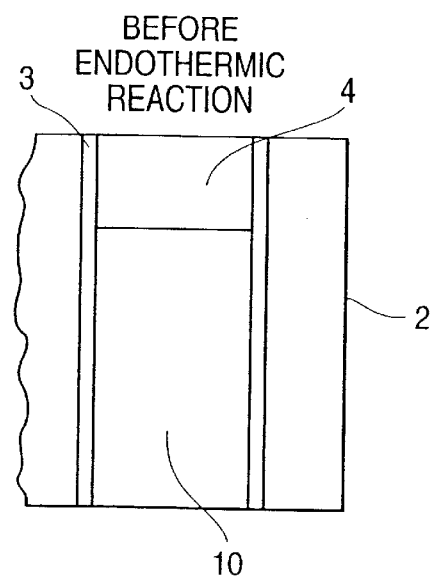
FIG. 4B is an enlarged view of a via hole of the circuit board of FIG. 3 showing the endothermic material in the via hole before endothermic reaction.

Following insertion of the endothermic material 10 into the via holes 4, to preferably fill the holes as indicated in FIGS. 3 and 4, the surface mounted component 7 is placed on the topside of the board and reflow soldered to form solder joints on the topside of the board between pads 5 and solder balls 9. Because of the proximity of these solder joints to the metal plating of the vias 3, these joints would ordinarily be at risk of reflow during subsequent wave soldering other joints of the circuit board from heat conducted from the solder wave through the vias in the board which are in heat conducting relation with the pads 5 and topside solder joints thereon. However, as a result of the presence of the endothermic material 10 in the via holes 4, during the wave soldering the endothermic material will increase in volume after its endothermic reaction such as melting, see FIG. 4A. The endothermic material will absorb some heat in the process of melting without any increase in temperature. When it melts it will wet the plated through hole walls of the vias 3 and stay in the via holes 4 due to capillary forces. Caps 12 at the bottom of the via holes, see FIG. 3, also keep the melted endothermic material from running out of the via holes.

When the temperature reduces again after wave soldering, the endothermic material will solidify and give up the heat it absorbed during the heating process, but then the temperature will be low enough and not affect the solder joints on the topside, surface mounted components. Thus, when the endothermic material in a via hole in the example embodiment is melting during wave soldering, it is absorbing the heat which otherwise would travel up its via and reach the surface mount solder joint or joints of the packages soldered on the topside of the board in heat conducting relation to the vias. Hence, in effect the endothermic material is using up some of the heat and in effect reducing the maximum temperature the surface mount solder joints are exposed to on the topside of the board. A further technical advantage of the invention is that this result is accomplished without impacting the design of the circuit boards or requiring the use of hardware accessories in the board assembly process.

While we have shown and described one example embodiment in accordance with the present invention, it is understood that the same is not limited thereto, but is susceptible to numerous changes and modifications as known to those skilled in the art. Therefore, we do not wish to be limited to the details shown and described herein, but intend to cover all such changes and modifications as are encompassed by the scope of the appended claims.

We claim:

1. A method of wave soldering a circuit board having a solder joint on the topside of the board and at least one through via in the board formed by electrically conductive plating in a via hole, the via being in heat conducting relation with the topside solder joint, the method comprising:
    subjecting the circuit board to a solder wave; and
    absorbing heat conducted from the solder wave through the at least one via with an endothermic material located within the via hole which undergoes a heat absorbing phase change to heat being conducted from the solder wave through the at least one via during wave soldering.

2. The method according to claim 1, wherein the phase change is melting.

3. The method according to claim 2, further comprising solidifying the melted endothermic material in the via hole when the temperature reduces after wave soldering to cause the endothermic material to give up the heat it absorbed during the wave soldering.

4. The method according to claim 2, including retaining the melted endothermic material in the via hole.

5. The method according to claim 4, wherein the melted endothermic material is retained in the via hole by a cap over the lower end of the via hole.

6. The method according to claim 4, wherein the melted endothermic material is retained in the via hole by capillary forces.

7. The method according to claim 1, further comprising retaining the endothermic material in the via hole after it undergoes the heat absorbing phase change.

8. The method according to claim 1, wherein the endothermic material undergoes the heat absorbing phase change in the temperature range of 50° C. to 200° C.

9. A method of making a circuit board comprising:
   providing a circuit board having at least one via formed by electrically conductive plating in a via hole, the via extending through the circuit board in heat conducting relation with a surface mount pad on the topside of the board; and
   locating an endothermic material in the via hole of the via, the endothermic material having a characteristic of undergoing a heat absorbing phase change to heat being conducted from a solder wave through the via during wave soldering of the circuit board.

10. The method according to claim 9, including capping the lower end of the via hole to retain the endothermic material therein during wave soldering.

11. The method according to claim 9, wherein the locating includes inserting a preform of the endothermic material into the via hole.

12. The method according to claim 9, wherein the locating includes hot dispensing the endothermic material into the via hole.

13. The method according to claim 9, further comprising surface mounting a component to the pad on the topside of the circuit board after the endothermic material is located in the via hole.

14. The method according to claim 13, wherein the component mounted on the topside of the board on the pad is a ball grid array component.

15. The method according to claim 9, wherein the at least one via is located in the pad on the topside of the board.

16. The method according to claim 9, wherein the at least one via is located between adjacent pads on the topside of the circuit board.

17. The method according to claim 9, wherein the phase change is melting.

18. The method according to claim 9, including filling the via hole with the endothermic material.

19. An electronic board product comprising:
   a circuit board having at least one via formed by electrically conductive plating in a via hole, the via extending through the circuit board in heat conducting relation with a pad on the topside of the board;
   a component which is mounted by way of a solder joint to the pad on the topside of the board; and
   an endothermic material located in the via hole of the via, the endothermic material having a characteristic of undergoing a heat absorbing phase change to heat being conducted from a solder wave through the via during wave soldering of the circuit board.

20. The electronic board product according to claim 19, further comprising a cap over the lower end of the via hole to retain the endothermic material therein during wave soldering.

21. The electronic board product according to claim 19, wherein the endothermic material fills the via hole.

22. The electronic board product according to claim 19, wherein the component is a ball grid array component which is mounted to the pad on the topside of the board by way of the solder joint.

23. The electronic board product according to claim 19, wherein the electronic board product is a mother board.

24. The electronic board product according to claim 19, wherein the electronic board product is a server board.

25. The electronic board product according to claim 19, wherein the phase change is melting.

26. The electronic board product according to claim 19, wherein the endothermic material undergoes the heat absorbing phase change in the temperature range of 50° C. to 200° C.

27. The method according to claim 1, wherein the endothermic material is selected from the group consisting of gutta-percha, iodides, and waxes, and has a melting temperature in the range of 50° C. to 200° C.

28. The method according to claim 9, wherein the endothermic material is selected from the group consisting of gutta-percha, iodides, and waxes, and has a melting temperature in the range of 50° C. to 200° C.

29. The electronic board according to claim 19, wherein the endothermic material is selected from the group consisting of gutta-percha, iodides, and waxes, and has a melting temperature in the range of 50° C. to 200° C.

30. The method according to claim 1, wherein the via hole has a diameter less than 22 mils.

31. The method according to claim 9, wherein the via hole has a diameter less than 22 mils.

32. The electronic board according to claim 19, wherein the via hole has a diameter less than 22 mils.

* * * * *

UNITED STATES PATENT AND TRADEMARK OFFICE
CERTIFICATE OF CORRECTION

PATENT NO. : 6,651,869 B2
DATED : November 25, 2003
INVENTOR(S) : Aspandiar et al.

It is certified that error appears in the above-identified patent and that said Letters Patent is hereby corrected as shown below:

<u>Title page,</u>
After Item [57], ABSTRACT, delete "32 Claims" and insert -- 33 Claims -- (as Total Claims), therefor.

<u>Column 6,</u>
Line 53, insert -- The method according to claim 9, wherein the heat absorbing reaction of the endothermic material is a phase change. -- as a new claim after Claim 32.

Signed and Sealed this

Ninth Day of November, 2004

JON W. DUDAS
*Director of the United States Patent and Trademark Office*